(12) United States Patent
Martin

(10) Patent No.: US 10,321,556 B2
(45) Date of Patent: Jun. 11, 2019

(54) AIR DIELECTRIC PRINTED CIRCUIT BOARD

(71) Applicant: HEWLETT PACKARD ENTERPRISE DEVELOPMENT LP, Houston, TX (US)

(72) Inventor: Steven Martin, Fort Collins, CO (US)

(73) Assignee: Hewlett Packard Enterprise Development LP, Houston, TX (US)

(*) Notice: Subject to any disclaimer, the term of this patent is extended or adjusted under 35 U.S.C. 154(b) by 68 days.

(21) Appl. No.: 15/143,081

(22) Filed: Apr. 29, 2016

(65) Prior Publication Data

US 2017/0318658 A1    Nov. 2, 2017

(51) Int. Cl.
*H05K 1/02* (2006.01)
*H05K 1/09* (2006.01)
*H05K 1/14* (2006.01)

(52) U.S. Cl.
CPC .......... *H05K 1/023* (2013.01); *H05K 1/0296* (2013.01); *H05K 1/09* (2013.01); *H05K 1/14* (2013.01); *H05K 2201/042* (2013.01)

(58) Field of Classification Search
USPC ....................................... 174/255
See application file for complete search history.

(56) References Cited

U.S. PATENT DOCUMENTS

| | | | |
|---|---|---|---|
| 6,370,030 B1 | 4/2002 | Bergstedt et al. | |
| 6,888,427 B2 | 5/2005 | Sinsheimer et al. | |
| 6,972,647 B1 | 12/2005 | Handforth et al. | |
| 9,247,648 B2* | 1/2016 | Vanfleteren | |
| 2004/0048420 A1 | 3/2004 | Miller | |
| 2006/0042829 A1 | 3/2006 | Matsuo et al. | |
| 2008/0194961 A1* | 8/2008 | Randall | A61B 8/00 600/459 |
| 2013/0189938 A1* | 7/2013 | Nakatani | H04B 1/0475 455/101 |
| 2013/0201648 A1* | 8/2013 | Cheng | H01L 23/552 361/803 |

FOREIGN PATENT DOCUMENTS

JP            3222394         10/1991

OTHER PUBLICATIONS

Frederic Parment, et al., "Air-filled SIW transmission line and phase shifter for high-performance and low-cost U-Band integrated circuits and systems", IEEE, May 5-27, 2015, 3 pages. http://ieeexplore.ieee.org/xpls/abs_all.jsp?arnumber=7175444.

* cited by examiner

*Primary Examiner* — Andargie M Aychillhum
(74) *Attorney, Agent, or Firm* — Rathe Lindenbaum LLP

(57) ABSTRACT

According to an example, an air dielectric printed circuit board (PCB) may include a first PCB layer including a first substrate and a first conductive layer formed of a first conductive material, and a second PCB layer including a second substrate and a second conductive layer formed of a second conductive material. The second conductive layer may be disposed in a directly facing configuration relative to the first conductive layer, and at a predetermined distance away from the first conductive layer to provide an air dielectric gap between the first and second conductive layers. The air dielectric PCB may further include a standoff that includes a first end and a second end that is opposite to the first end. The standoff may be attached to the first and second PCB layers respectively at the first and second ends thereof, and may include a predetermined length to maintain the predetermined distance.

20 Claims, 5 Drawing Sheets

AIR DIELECTRIC PRINTED CIRCUIT BOARD

BACKGROUND

A printed circuit board (PCB) includes conductive tracks, pads, or other features etched from conductive material. The conductive tracks, pads, or other features may be laminated onto a non-conductive substrate. The conductive layers may be formed of a material such as Copper. The conductive tracks, pads, or other features may be used to mechanically support and electrically connect electronic components. Examples of electronic components include capacitors, resistors, or other types of active devices. The electronic components may be soldered on the PCB. The electronic components may also be embedded in the PCB substrate. PCBs can be single sided, double sided, or include multiple layers. A single sided PCB may include one conductive layer. A double sided PCB may include two conductive layers. A multi-layer PCB may include outer and inner conductive layers. The different conductive layers may be connected by using vias.

BRIEF DESCRIPTION OF DRAWINGS

Features of the present disclosure are illustrated by way of example and not limited in the following figure(s), in which like numerals indicate like elements, in which.

DETAILED DESCRIPTION

Figure 1A:
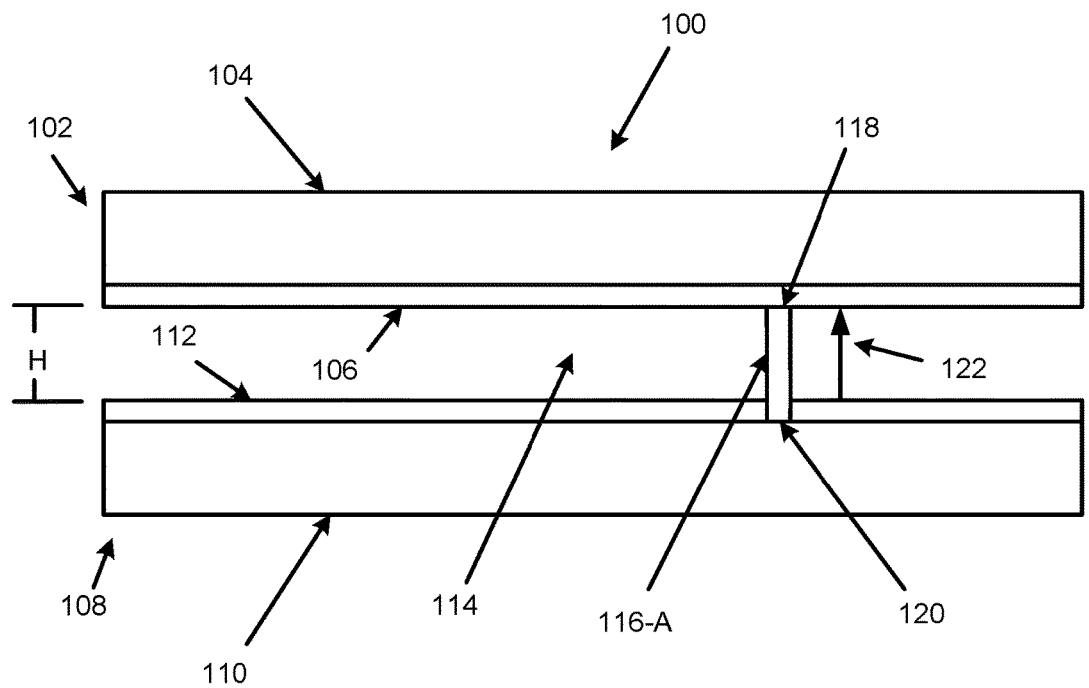
FIG. 1A illustrates a side view of an air dielectric printed circuit board (PCB)

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, and the term "including" means including but not limited to. The term "based on" means based at least in part on.

According to examples, an air dielectric printed circuit board (PCB) may include a first PCB layer including a first substrate and a first conductive layer formed of a first conductive material, and a second PCB layer including a second substrate and a second conductive layer formed of a second conductive material. The second conductive layer may be disposed in a directly facing configuration relative to the first conductive layer. Further, the second conductive layer may be disposed at a predetermined distance away from the first conductive layer. The predetermined distance provides an air dielectric gap between the first and second conductive layers. Further, the air dielectric PCB may include two or more standoffs. Each of the standoffs may be formed of a material different than the first and second substrates. Each of the standoffs may include a first end and a second end that is opposite to the first end. Each of the standoffs may be attached to the first and second PCB layers respectively at the first and second ends thereof. Further, each of the standoffs may include a predetermined length to maintain the predetermined distance that provides the air dielectric gap between the first and second conductive layers.

The substrate may be described as a non-conductive layer that includes insulation properties. An example of a substrate includes a glass epoxy, or other types of non-conductive materials.

The first and second conductive layers may be formed of a material such as Copper, or other types of conductive materials.

The air dielectric gap may provide for an uninterrupted formation of an electric field between the first and second conductive layers. The electric field may drive electrical signals between forward and return paths relative to the first and second conductive layers. For example, one of the first and second conductive layers may be used as a forward path for an electrical signal, and the other one of the first and second conductive layers may be used as the return path for the electrical signal.

With respect to the air dielectric gap, transmission of electrical signals across PCBs may suffer from loss due to the loss tangent of the substrate material. Because vacuum and air include lower loss tangents compared to substrate material, the air dielectric gap provides a lower loss pathway for transmitting electrical signals. Further, relative dielectric constants can slow the travel of electric signals by approximately the square root of the relative dielectric constant. Air includes a dielectric constant of approximately one. Therefore, because the square root of the dielectric constant for air is approximately one, the air dielectric gap provides a faster delivery technique for electrical signals without any dielectric associated drop in speed of the electrical signals.

With respect to the standoffs, each of the standoffs may be spaced from other standoffs at a predetermined spacing distance. The predetermined spacing distance may be determined such that an electric field generated between the first and second conductive layers is formed substantially within the air dielectric gap and substantially between the spaced standoffs. In this regard, while a relatively small percentage (e.g., 20%) of the electric field may travel through the first and second substrates, a relatively high percentage (e.g., 80%) of the electric field travels through the air dielectric gap and substantially between the spaced standoffs.

Moreover, the predetermined spacing distance for the standoffs may be determined such that an electric field generated between the first and second conductive layers is formed substantially within the air dielectric gap without interference from any of the standoffs. In this regard, as disclosed herein, the predetermined spacing distance may be set to a minimum distance that is approximately equal to a predetermined strength of the electric field. For example, a distance of D from a center of a conductive layer may be determined such that the electric field includes a strength of approximately $8.0\times10^3$ V/m or greater at its point of contact with a standoff, or another user-specified electric field strength value. Alternatively, the electric field strength value at its point of contact with a standoff may be based on design constraints associated with the air dielectric PCB. Examples of design constraints may include dimensional constraints of components that the air dielectric PCB is used with. Thus, as disclosed herein, the predetermined spacing distance may be specified as 2×D.

According to an example, the first and second substrates may include substantially uniform cross-sections respectively across the first and second PCB layers. In this regard, each of the first and second substrates may be formed without any gaps, notches, etc.

According to an example, the first substrate may be bonded to the first conductive layer, and the second substrate may be bonded to the second conductive layer. In this regard, the first and second conductive layers may be attached to the first and second substrates by bonding, instead of the substrates being etched.

Figure 1B:
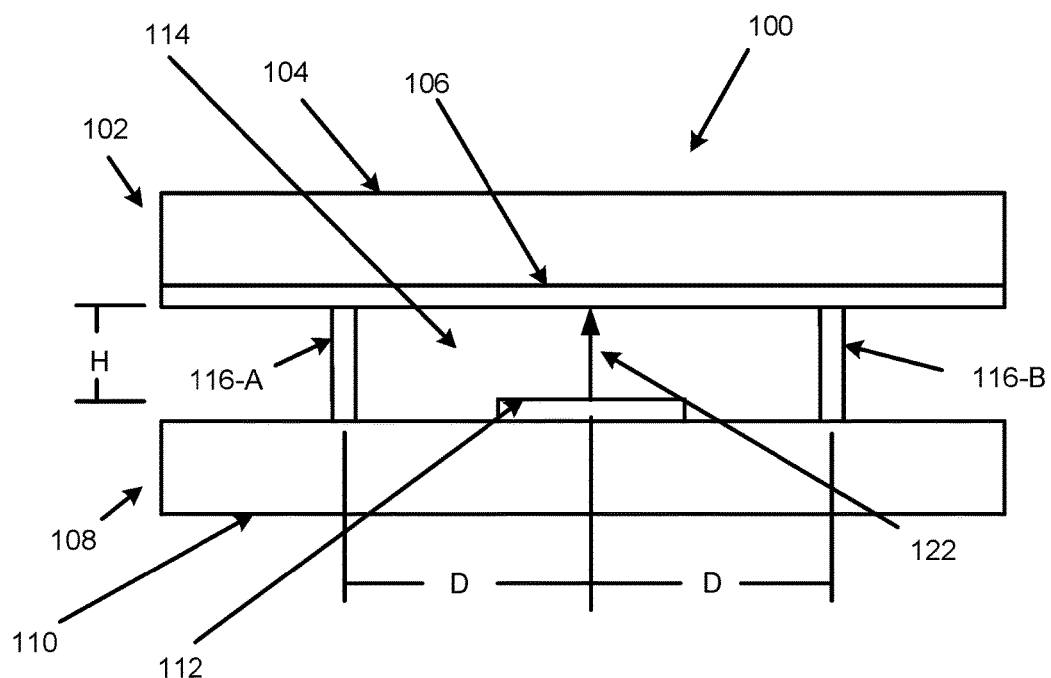
FIG. 1B illustrates a front view of the air dielectric PCB of FIG. 1A, according to an example of the present disclosure.
Figure 2:
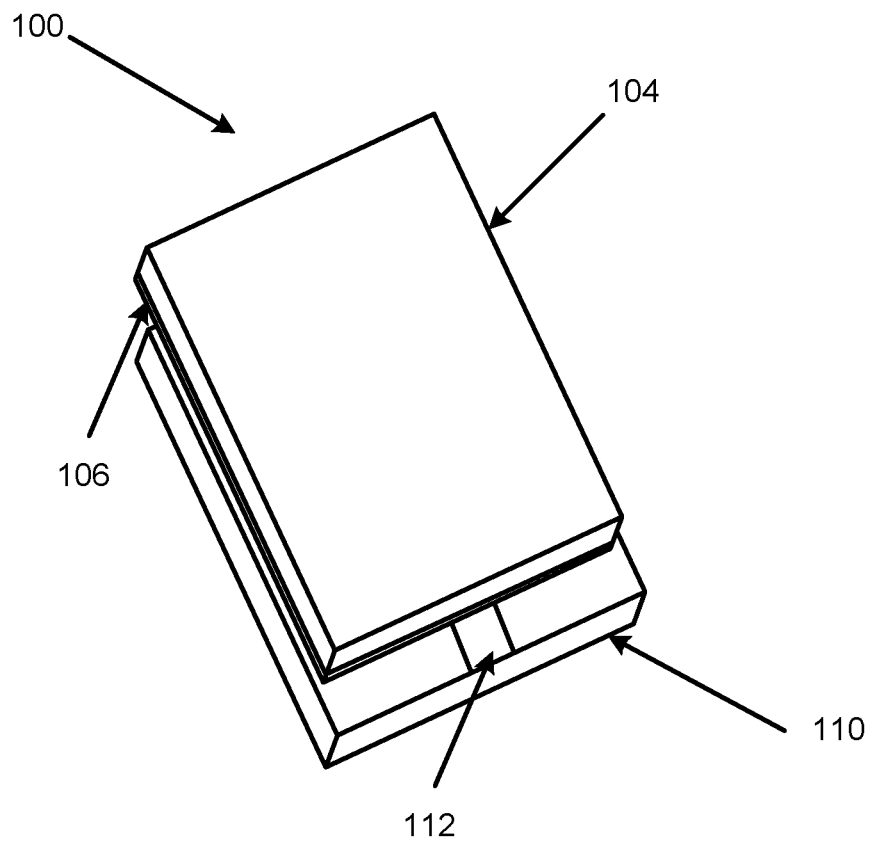
FIG. 2 illustrates an isometric view of the air dielectric PCB of FIGS. 1A and 1B, according to an example of the present disclosure.

FIG. 1A illustrates a side view of an air dielectric PCB 100, and FIG. 1B illustrates a front view of the air dielectric PCB 100, according to an example of the present disclosure. FIG. 2 illustrates an isometric view of the air dielectric PCB 100, according to an example of the present disclosure.

Referring to FIGS. 1A and 1B, the air dielectric PCB 100 may include a first PCB layer 102 including a first substrate 104 and a first conductive layer 106 formed of a first conductive material. The air dielectric PCB 100 may further include a second PCB layer 108 including a second substrate 110 and a second conductive layer 112 formed of a second conductive material. As shown in FIGS. 1A and 1B, the second conductive layer 112 may be disposed in a directly facing configuration relative to the first conductive layer 106. Further, the second conductive layer 112 may be disposed at a predetermined distance H away from the first conductive layer 106. The predetermined distance H may provide an air dielectric gap 114 between the first conductive layer 106 and the second conductive layer 112.

The air dielectric PCB 100 may further include a standoff 116. For example, as shown in FIGS. 1A and 1B, the air dielectric PCB 100 may include two or more standoffs 116 (designated as 116-A and 116-B).

For the example of FIGS. 1A and 1B, each of the standoffs 116 may be formed of a material different than the first substrate 104 and the second substrate 110. For example, the first substrate 104 and the second substrate 110 may be formed of a glass epoxy material. Thus, the standoffs 116 may be formed of a material other than the glass epoxy material. For example, the standoffs 116 may be formed of a metallic material, a plastic material, or other types of materials.

The standoffs 116 may include a first end 118 and a second end 120 that is opposite to the first end 118. In this regard, although the first end 118 and the second end 120 are illustrated at the contact between the standoffs 116 and the first conductive layer 106 and the second conductive layer 112, respectively, the first end 118 and the second end 120 may include the portion of the standoffs 116 that is within the first conductive layer 106 and the second conductive layer 112. Alternatively, the standoffs 116 may also protrude from the first conductive layer 106 and the second conductive layer 112 into the first substrate 104 and the second substrate 110, respectively. Alternatively, the standoffs 116 may directly protrude into the second substrate 110, without contact with the second conductive layer 112.

The standoffs 116 may be attached to the first PCB layer 102 and the second PCB layer 108, respectively, at the first end 118 and the second end 120 thereof. For example, the first end 118 of a standoff may be attached to the first conductive layer 106 and/or the first substrate 104. Further, the second end 120 of a standoff may be attached to the second conductive layer 112 and/or the second substrate 110.

Each of the standoffs 116 may include threaded ends at the first end 118 and the second end 120. A threaded end may be disposed in a corresponding orifice in the first conductive layer 106, the second conductive layer 112, the first substrate 104, or the second substrate 110 for attachment of a standoff to the first conductive layer 106, the second conductive layer 112, the first substrate 104, or the second substrate 110. Alternatively, each of the standoffs 116 may be attached to the first PCB layer 102 and the second PCB layer 108 by other techniques, such as soldering, gluing, etc.

The standoffs 116 may include a predetermined length to maintain the predetermined distance H. The predetermined length may be defined by the depth of orifices in the first conductive layer 106 and the second conductive layer 112 (or the first substrate 104 and the second substrate 110) that the standoffs 116 protrude into, and additionally the predetermined distance H. Alternatively, the standoffs 116 may be shaped differently compared to the configuration of FIGS. 1A and 1B, where the shape of the standoffs 116 is formed such that the standoffs 116 maintain a predetermined distance H between the first PCB layer 102 and the second PCB layer 108. For example, the standoffs 116 may include a circular, slanted, or other types of shapes.

Figure 3:
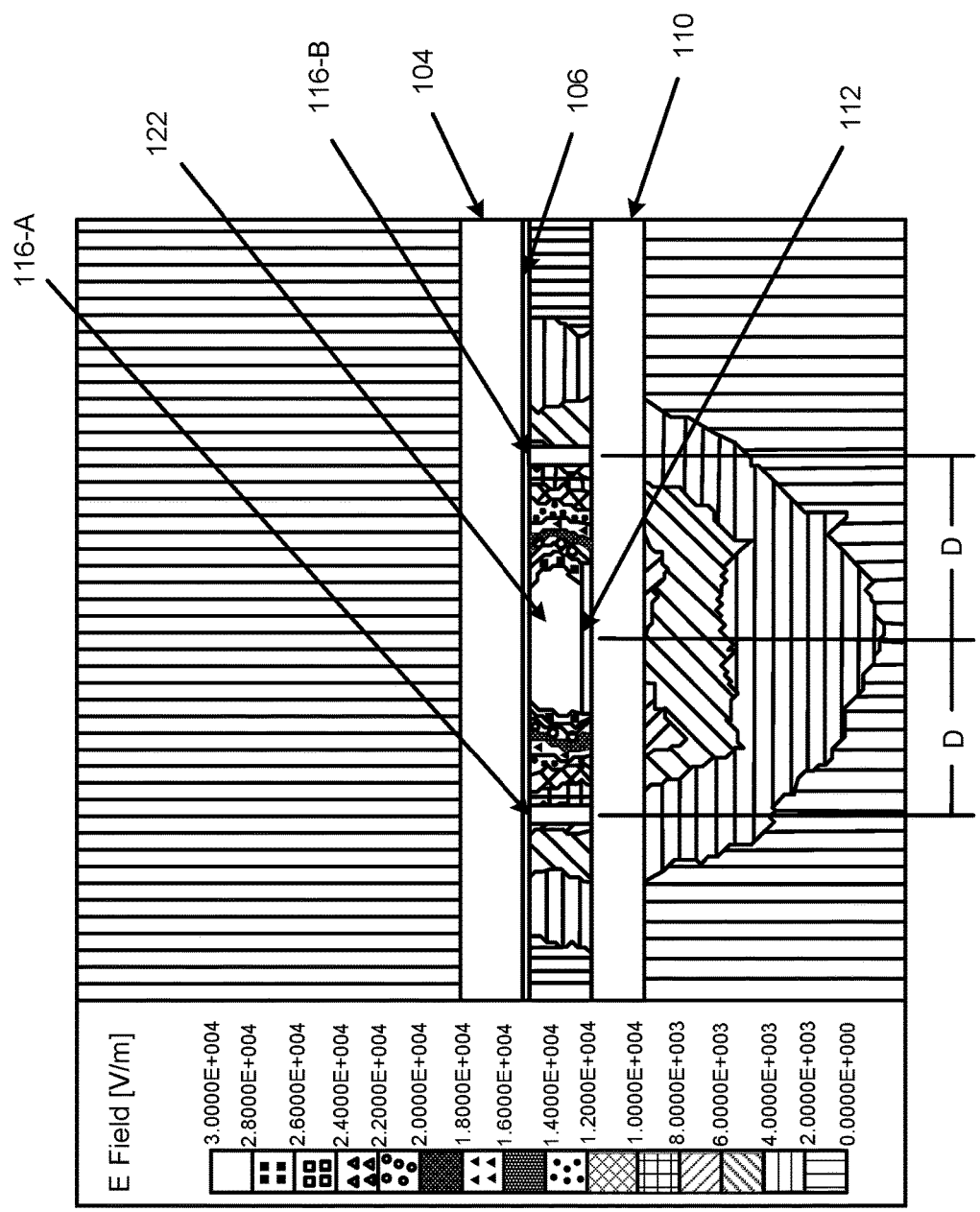
FIG. 3 illustrates an electric field display for the air dielectric PCB of FIGS. 1A and 1B, according to an example of the present disclosure.

Each of the standoffs 116 may be spaced from another adjacent standoff at a predetermined spacing distance. The predetermined spacing distance may be specified to a minimum distance that is approximately equal to a predetermined strength of an electric field 122. For example, FIG. 3 illustrates an electric field display for the air dielectric PCB 100, according to an example of the present disclosure. Referring to FIG. 3, the electric field 122 includes a level of approximately $3.0\times10^4$ V/m in the area between the standoffs 116-A and 116-B. However, as the electric field 122 expands in the area of the standoffs 116-A and 116-B, and further away from the standoffs 116-A and 116-B, the level of the electric field 122 reduces. In this regard, referring again to FIGS. 1A and 1B, a distance of D from a center of the second conductive layer 112 may be determined such that the electric field includes a strength of approximately $8.0\times10^3$ V/m or greater at its point of contact with a standoff, or another user-specified electric field strength value. Thus, the predetermined spacing distance may be specified as 2×D. The predetermined spacing distance of 2×D may be determined such that the electric field generated between the first conductive layer 106 and the second conductive layer 112 is formed substantially within the air dielectric gap 114, and substantially between the spaced standoffs, without interference from any of standoffs 116-A and 116-B.

Figure 4:
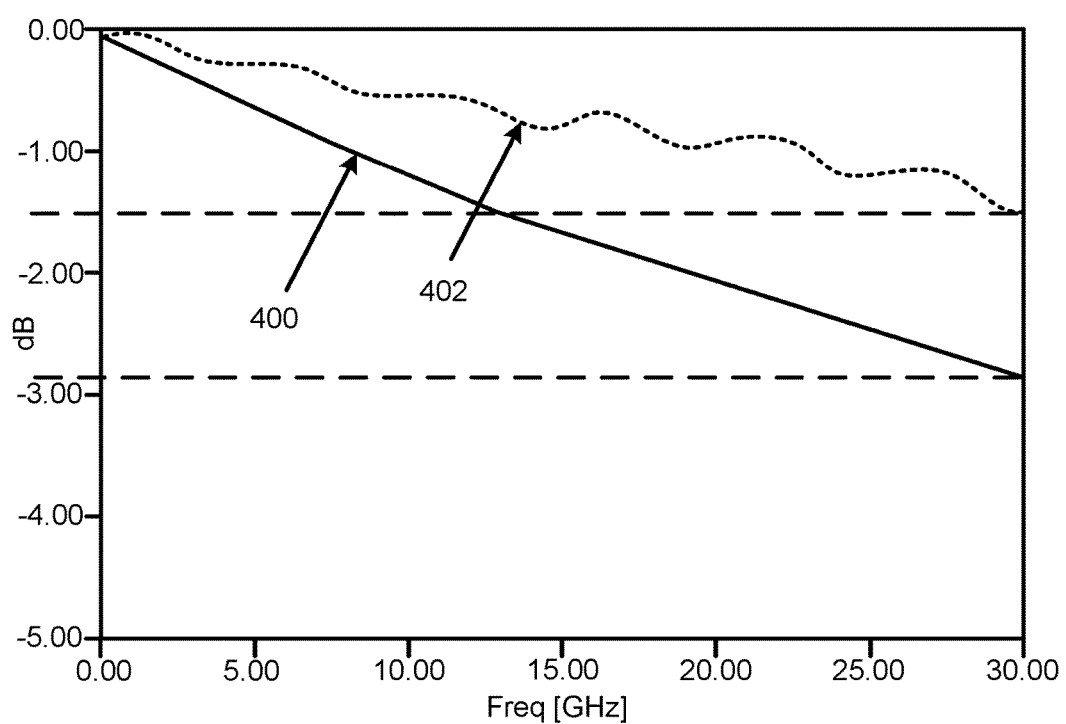
FIG. 4 illustrates a graph of transmission loss for the air dielectric PCB of FIGS. 1A and 1B, according to an example of the present disclosure.

FIG. 4 illustrates a graph of transmission loss for the air dielectric PCB 100, according to an example of the present disclosure.

Referring to FIG. 4, the solid curve at 400 represents transmission loss for a PCB that includes a single substrate and conductive layers bonded to opposite sides of the single substrate for a frequency range of 0 to 30.00 GHz. The PCB for the solid curve at 400 includes a dielectric constant of Er=4.2 and loss tangent=0.02, which are properties of the single substrate. For example, the single substrate may include a FR-4 material, where FR-4 may represent a grade designation assigned to glass-reinforced epoxy laminate sheets. The dashed curve at 402 represents transmission loss for the PCB 100 for the frequency range of 0 to 30.00 GHz. The substrates and conductive materials for both the solid curve at 400 and the dashed curve at 402 include a length of 1.0 inches. Based on the implementation of the air dielectric gap 114, with air including a dielectric constant of Er=1.0 and a Loss Tangent=0.0, at higher frequencies of approximately 30.00 GHz, the PCB 100 reduces the transmission loss by approximately 1.2 dB. Moreover, for every additional inch of length, the transmission loss increases by a factor directly proportional to the length. For example, for ten inches, the PCB 100 reduces the transmission loss by approximately 12 dB, and so forth.

Figure 5:
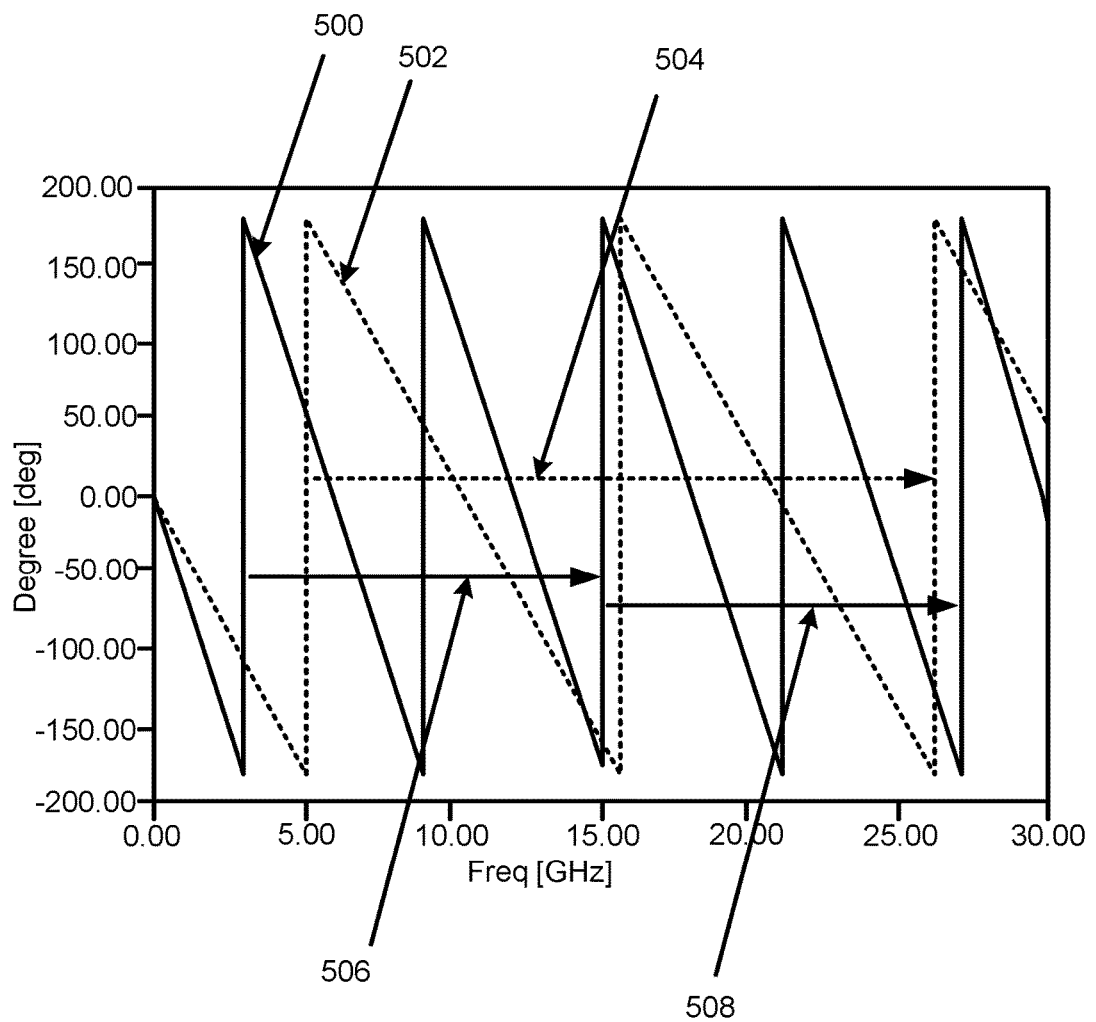
FIG. 5 illustrates a phase graph for the air dielectric PCB of FIGS. 1A and 1B, according to an example of the present disclosure.

FIG. 5 illustrates a phase graph for the air dielectric PCB 100, according to an example of the present disclosure.

Referring to FIG. 5, the solid curve at 500 represents a wavelength pattern for a PCB that includes a single substrate and conductive layers bonded to opposite sides of the single substrate for a frequency range of 0 to 30.00 GHz. The PCB for the solid curve at 500 includes a dielectric constant of Er=4.2 and loss tangent=0.02, which are properties of the single substrate. The dashed curve at 502 represents a wavelength pattern for the PCB 100 for the frequency range of 0 to 30.00 GHz. The substrates and conductive materials for both the solid curve at 500 and the dashed curve at 502 include a length of 1.0 inches. The arrows at 504, 506, and 508, represent 360°, one wavelength, in length. Referring to the solid curve at 500 and the corresponding arrows at 506 and 508, and to the dashed curve at 502 and the corresponding arrow at 504, the PCB 100 wavelength represented by the dashed curve at 502 travels approximately twice as fast compared to the PCB represented by the solid curve at 500. For example, the arrow at 504 represents the combined distance of the arrows at 506 and 508.

Thus, referring to FIGS. 4 and 5, the PCB 100 includes a reduced transmission loss and faster electrical signal travel compared to a PCB that includes a single substrate and conductive layers bonded to opposite sides of the single substrate.

What has been described and illustrated herein is an example along with some of its variations. The terms, descriptions and figures used herein are set forth by way of illustration and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. An air dielectric printed circuit board (PCB) comprising:
    a first PCB layer including a first substrate and a first conductive layer formed of a first conductive material;
    a second PCB layer including a second substrate and a second conductive layer formed of a second conductive material, wherein the second conductive layer is disposed
        in a directly facing configuration relative to the first conductive layer, and
        at a predetermined distance away from the first conductive layer, wherein the predetermined distance provides an air dielectric gap between the first and second conductive layers; and
    at least two standoffs, wherein each of the at least two standoffs
        is formed of a material different than the first and second substrates,
        includes a first end and a second end that is opposite to the first end,
        is attached to the first and second PCB layers respectively at the first and second ends thereof, and
        includes a predetermined length to maintain the predetermined distance.

2. The air dielectric PCB according to claim 1, wherein a standoff of the at least two standoffs is spaced from another standoff of the at least two standoffs at a predetermined spacing distance, and wherein the predetermined spacing distance is determined such that an electric field generated between the first and second conductive layers is formed substantially within the air dielectric gap and substantially between the spaced standoffs, without interference from any one of the at least two standoffs.

3. The air dielectric PCB according to claim 1, wherein the first conductive material or the second conductive material includes Copper.

4. The air dielectric PCB according to claim 1, wherein a standoff of the at least two standoffs includes a threaded end that is disposed in a corresponding orifice in the first conductive layer, the second conductive layer, the first substrate, or the second substrate for attachment of the standoff to the first conductive layer, the second conductive layer, the first substrate, or the second substrate.

5. The air dielectric PCB according to claim 1, wherein the first substrate includes a substantially uniform cross-section across the first PCB layer.

6. The air dielectric PCB according to claim 1, wherein the second substrate includes a substantially uniform cross-section across the second PCB layer.

7. The air dielectric PCB according to claim 1, wherein the first and second substrates include substantially uniform cross-sections respectively across the first and second PCB layers.

8. The air dielectric PCB according to claim 1, wherein the first substrate is bonded to the first conductive layer, and the second substrate is bonded to the second conductive layer.

9. The air dielectric PCB according to claim 1, wherein the first substrate and the second substrate are formed of a glass epoxy material.

10. The air dielectric PCB according to claim 9, wherein:
    the at least two standoffs are formed of a plastic material;
    the first end of the at least two standoffs protrudes directly into the first substrate without contacting the first conductive layer; and
    the second end of the at least two standoffs protrudes directly into the second substrate without contacting the second conductive layer.

11. The air dielectric PCB according to claim 1, wherein the at least two standoffs protrude into the first conductive layer and the first substrate at the first end, and protrude into the second conductive layer and the second substrate at the second end.

12. An air dielectric printed circuit board (PCB) comprising:
    a first PCB layer including a first substrate and a first conductive layer formed of a first conductive material;
    a second PCB layer including a second substrate and a second conductive layer formed of a second conductive material, wherein the second conductive layer is disposed
        in a directly facing configuration relative to the first conductive layer, and
        at a predetermined distance away from the first conductive layer, wherein the predetermined distance provides an air dielectric gap between the first and second conductive layers; and at least two standoffs, wherein each of the at least two standoffs
- includes a first end and a second end that is opposite to the first end,
- is attached to the first and second PCB layers respectively at the first and second ends thereof, and
- includes a predetermined shape to maintain the predetermined distance, and wherein a standoff of the at least two standoffs is spaced from another standoff of the at least two standoffs at a predetermined spacing distance, and wherein the predetermined spacing distance is determined such that an electric field generated between the first and second conductive layers is formed substantially within the air dielectric gap and substantially between the spaced standoffs.

13. The air dielectric PCB according to claim 12, wherein each of the standoffs is formed of a material different than the first and second substrates.

14. The air dielectric PCB according to claim 13, wherein:
each of the standoffs is formed of a plastic material;
the first substrate is bonded to the first conductive layer; and
the second substrate is bonded to the second conductive layer.

15. The air dielectric PCB according to claim 12, wherein the first and second substrates include substantially uniform cross-sections respectively across the first and second PCB layers.

16. The air dielectric PCB according to claim 12, wherein the first substrate is bonded to the first conductive layer, and the second substrate is bonded to the second conductive layer.

17. An air dielectric printed circuit board (PCB) comprising:
a first PCB layer including a first substrate and a first conductive layer formed of a first conductive material;
a second PCB layer including a second substrate and a second conductive layer formed of a second conductive material, wherein
the first and second substrates include a substantially uniform cross-section respectively across the first and second PCB layers,
the second conductive layer is disposed in a directly facing configuration relative to the first conductive layer, and
the second conductive layer is disposed at a predetermined distance away from the first conductive layer, wherein the predetermined distance provides an air dielectric gap between the first and second conductive layers; and at least one standoff, wherein the at least one standoff
- includes a first end and a second end that is opposite to the first end,
- is attached to the first and second PCB layers respectively at the first and second ends thereof, and
- includes a predetermined shape to maintain the predetermined distance.

18. The air dielectric PCB according to claim 17, wherein the at least one standoff is formed of a material different than the first and second substrates.

19. The air dielectric PCB according to claim 17, wherein the at least one standoff includes at least two standoffs, wherein a standoff of the at least two standoffs is spaced from another standoff of the at least two standoffs at a predetermined spacing distance, and wherein the predetermined spacing distance is determined such that an electric field generated between the first and second conductive layers is formed substantially within the air dielectric gap and substantially between the spaced standoffs.

20. The air dielectric PCB according to claim 17, wherein:
the at least one standoff includes at least two standoffs;
the first end of the at least two standoffs is threaded and protrudes directly into the first substrate without contacting the first conductive layer; and
the second end of the at least two standoffs is threaded and protrudes directly into the second substrate without contacting the second conductive layer.

* * * * *